United States Patent
Chen

(10) Patent No.: US 7,034,363 B2
(45) Date of Patent: Apr. 25, 2006

(54) BI-DIRECTIONAL EOS/ESD PROTECTION DEVICE

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 250 days.

(21) Appl. No.: 10/222,760

(22) Filed: Aug. 16, 2002

(65) Prior Publication Data

US 2003/0035257 A1    Feb. 20, 2003

(30) Foreign Application Priority Data

Aug. 17, 2001   (TW)   ............................... 90120216 A

(51) Int. Cl.
*H01L 23/62*     (2006.01)

(52) U.S. Cl. ....................... 257/355; 257/356; 257/173

(58) Field of Classification Search ................. 361/56; 257/355, 356, 173
See application file for complete search history.

(56) References Cited

U.S. PATENT DOCUMENTS 6,236,087 B1 *   5/2001   Daly et al. .................. 257/355

* cited by examiner

*Primary Examiner*—Sara Crane
(74) *Attorney, Agent, or Firm*—Birch, Stewart, Kolasch & Birch, LLP

(57) ABSTRACT

A bi-directional EOS/ESD protection device, suitable for application on an I/O port. The circuit includes a P-type semiconductor layer, a first N-type conductive layer, a second N-type conductive layer, a first P-type doped region, a first N-type doped region, a second N-type doped region and a second P-type doped region. The first N-type conductive layer and the second N-type conductive layer are formed separately on the P-type semiconductor layer. The first P-type doped region and the first N-type doped region are formed on the first N-type conductive layer. The second N-type doped region and the second P-type doped region are formed on the second N-type conductive layer. The first N-type conductive layer is coupled to an I/O pad, and the second N-type conductive layer is coupled to a power line. Signals irrespective of conductivity type are transmitted via the I/O pad. When voltages of signals at the I/O pad exceed predetermined amplitude, the bi-directional EOS/ESD protection device is triggered to release the ESD stress and protect an inner circuit.

15 Claims, 8 Drawing Sheets

BI-DIRECTIONAL EOS/ESD PROTECTION DEVICE

Pursuant to 35 U.S.C. 119(a)–(d), this application claims priority from Taiwanese application no. 090120216, filed with the Taiwanese Patent Office, Taiwan, on Aug. 17, 2001.

BACKGROUND OF THE INVENTION

1. Field of the Invention

The present invention relates in general to an electrical overstress (EOS) and electrostatic discharge (ESD) protection device on an integrated circuit (IC). In particular, the present invention relates to a bi-directional EOS/ESD protection component.

2. Description of the Related Art

As components of integrated circuits (ICs) become more delicate with growing capacities, the components also become more vulnerable to unexpected electrical overstress (EOS) and electrostatic discharge (ESD). EOS and ESD resilience is thus crucial for measuring reliability of ICs. It is common to have EOS/ESD protection circuits formed between input/output (I/O) ports or power lines to protect components of ICs from EOS/ESD events.

FIG. 1A shows a conventional EOS/ESD protection circuit implemented by a diode. FIG. 1B shows a voltage-current diagram of the circuit in FIG. 1A. When the voltage at a pad 10 exceeds a breakdown voltage $V_{break}$ of the diode, the diode is triggered to release the stress at the pad 10 and protect an inner circuit 12.

FIG. 2A shows a cross section and equivalent symbols of components in a conventional semiconductor-controlled rectifier (SCR). FIG. 2B shows a voltage-current diagram of the SCR in FIG. 2A. FIG. 2C shows a conventional EOS/ESD protection circuit implemented by a SCR for an I/O pad 10. The voltage across the SCR is retained at a low holding voltage $V_{hold}$ after triggering. Therefore, the SCR releases large current without being overheated.

As shown in the voltage-current curves in FIGS. 1B and 2B, the diode and the SCR are triggered when backward biased. That is, signals with negative voltages cannot be transmitted at the I/O pad 10 because of clamping of the diode and SCR. Simply put, signals at the structures in FIGS. 1A to 2C are allowed one way (greater than 0) only. When two-way signals (signals greater or smaller than 0) occur at the I/O port, a bi-directional EOS/ESD protection circuit is required to protect components in ICs.

SUMMARY OF THE INVENTION

It is therefore the object of the present invention to provide a bi-directional EOS/ESD protection circuit not only protecting ICs from positive EOS/ESD stress with respect to a power line, but also negative EOS/ESD stress with respect to the power line.

In accordance to the object above, the present invention provides a bi-directional electrical overstress (EOS) and electrostatic discharge (ESD) protection device, suitable for application of an input/output (I/O) pad. The EOS/ESD protection device comprises an NPN bipolar-junction transistor (BJT), a first PNP BJT and a second PNP BJT. Each BJT has a base, a first emitter/collector and a second emitter/collector. The base of the NPN BJT is coupled to the second emitter/collector of the first PNP BJT and the second emitter/collector of the second PNP BJT. A base of the first PNP BJT and the first emitter/collector of the NPN BJT are formed by a first N-type conductive layer coupled to the I/O pad. A base of the second PNP BJT and the second emitter/collector of the NPN BJT are formed by a second N-type conductive layer coupled to a power line.

The first emitter/collector of the first PNP BJT is coupled to the I/O pad. The first emitter/collector of the second PNP BJT is coupled to the power line.

The present invention further provides a bi-directional EOS/ESD protection device, suitable for application of an I/O port. The EOS/ESD protection circuit comprises a P-type semiconductor layer, a first N-type conductive layer, a second N-type conductive layer, a first P-type doped region, a first N-type doped region, a second N-type doped region and a second P-type doped region. The first N-type conductive layer and the second N-type conductive layer are formed separately on the P-type semiconductor layer. The first P-type doped region and the first N-type doped region are formed on the first N-type conductive layer. The second N-type doped region and the second P-type doped region are formed on the second N-type conductive layer. The first N-type conductive layer is coupled to an I/O pad, and the second N-type conductive layer is coupled to a power line.

Signals at the I/O pad with voltages smaller than predetermined amplitude are transmitted to an inner circuit irrespective of the conductivity types. When voltages across the I/O pad or the power line, irrespective of the conductivity types, exceed the predetermined amplitude, the EOS/ESD protection device is triggered to clamp the voltages at the I/O pad so that EOS/ESD stress is released with little power generated.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood by reading the subsequent detailed description in conjunction with the examples and references made to the accompanying drawings which are given by way of illustration only, and thus are not limitative of the present invention, and wherein.

DETAILED DESCRIPTION OF THE INVENTION

Figure 3A:
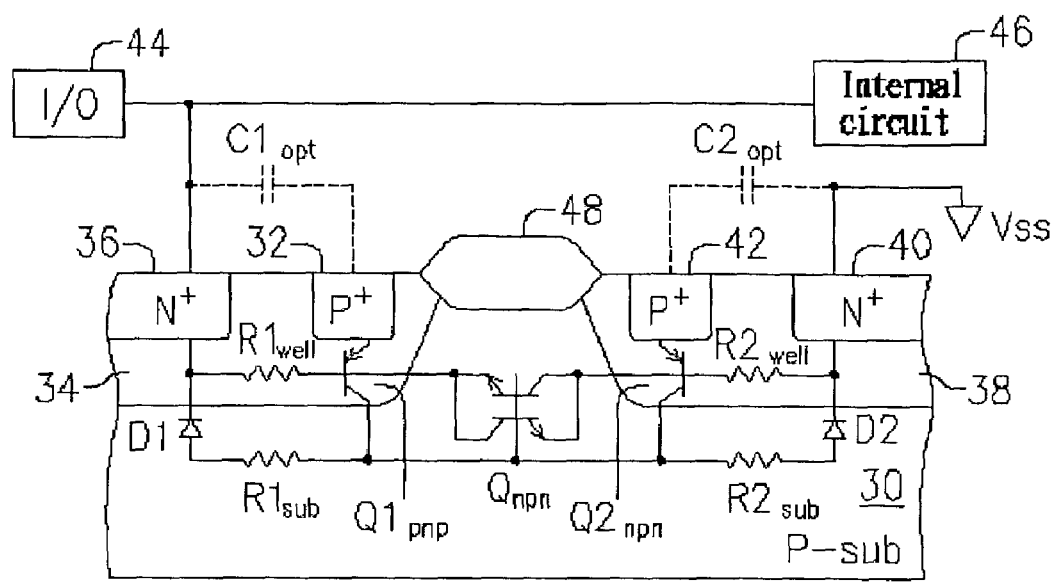
FIG. 3A is a cross section of an EOS/ESD protection circuit of the present invention.
Figure 3B:
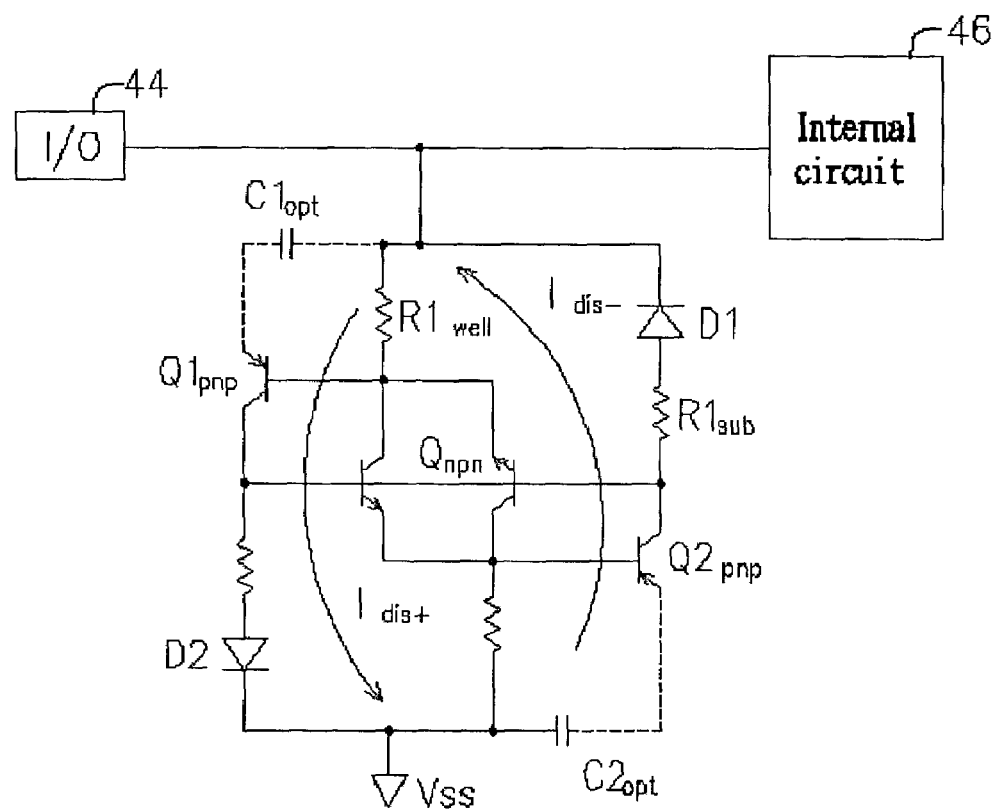
FIG. 3B is an equivalent circuit of FIG. 3A.

FIG. 3A shows a cross section of an EOS/ESD protection circuit of the present invention. FIG. 3B is an equivalent circuit of FIG. 3A.

The EOS/ESD protection circuit of the present invention is formed on a P-substrate 30. A parasitic transistor $Q1_{pnp}$ is vertically formed by a P+ dope region 32, an N-well 34 and the P-substrate 30. A parasitic transistor $Q2_{pnp}$ is vertically formed by a P+ dope region 42, an N-well 38 and the P-substrate 30. A parasitic transistor $Q_{npn}$ is horizontally formed under a field oxide layer 48 between the N-wells 34 and 38 by the N-well 34, the P-substrate 30 and the N-well 38. The N+ doped region 36 coupled to an I/O pad 44 is an electric contact of the N-well 34. A spread resistance $R1_{well}$ is formed between the transistor $Q1_{pnp}$ and the N+ doped region 36. Similarly, the N+ doped region 40 coupled to a power line VSS is an electric contact of the N-well 38. A spread resistance $R2_{well}$ is formed between the transistor $Q2_{pnp}$ and the N+ doped region 40. A diode D1 and an equivalent resistance $R1_{sub}$ formed in the P-substrate 30 are located between the base of the transistor $Q_{npn}$ and the I/O pad 44. A diode D2 and an equivalent resistance $R2_{sub}$ formed in the P-substrate 30 are located between the base of the transistor $Q_{npn}$ and the power line VSS. The N+ doped regions and the P+ doped regions are formed simultaneously with drains and sources of NMOSs and PMOSs in an IC process.

In FIG. 3A, two optional capacitors $C1_{opt}$ and $C2_{opt}$ are respectively coupled between the P+ doped region 32 and the N+ doped region 36, and the P+ doped region 42 and the N+ doped region 40 to enhance triggering speed of the EOS/ESD protection device. The P+ doped regions 32 and 42 are not coupled to any specified electric potential and thus float. The equivalent components and the connections of the circuit in FIG. 3A are shown in FIG. 3B.

Figure 3C:
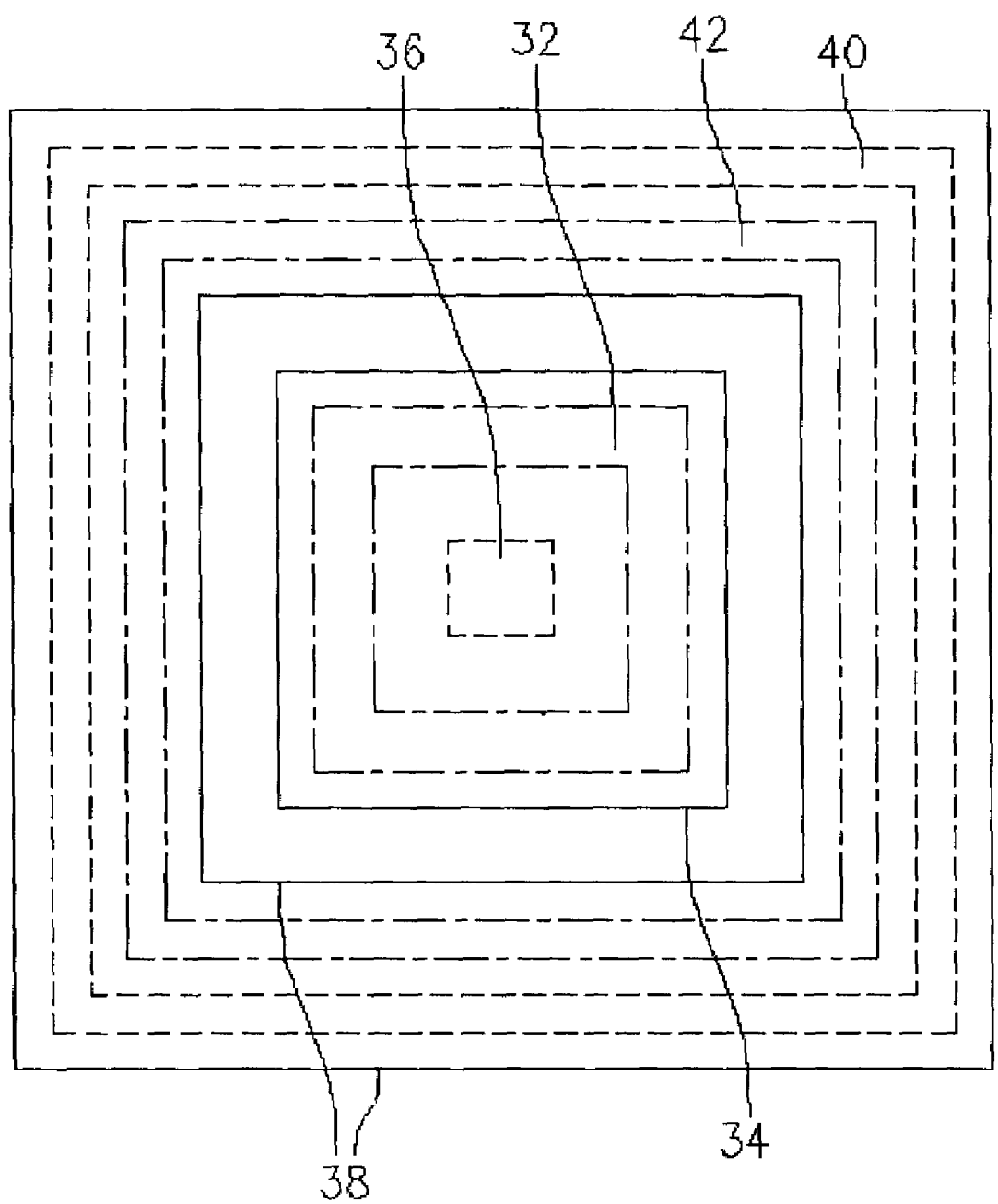
FIG. 3C is a possible layout of the EOS/ESD protection circuit in FIG. 3A.

FIG. 3C shows a possible layout of the EOS/ESD protection circuit in FIG. 3A. The N+ doped region 38 surrounds the N+ doped region 34 with a field oxide layer in between (not shown in FIG. 3C). Circular doped regions in the N+ doped region 38 are, respectively from the outer side inward, the N+ doped region 40 and the P+ doped region 42. Circular doped regions in the N+ doped region 34 are, respectively from the outer side inward, the N+ doped region 32 and the P+ doped region 36.

Figure 4:
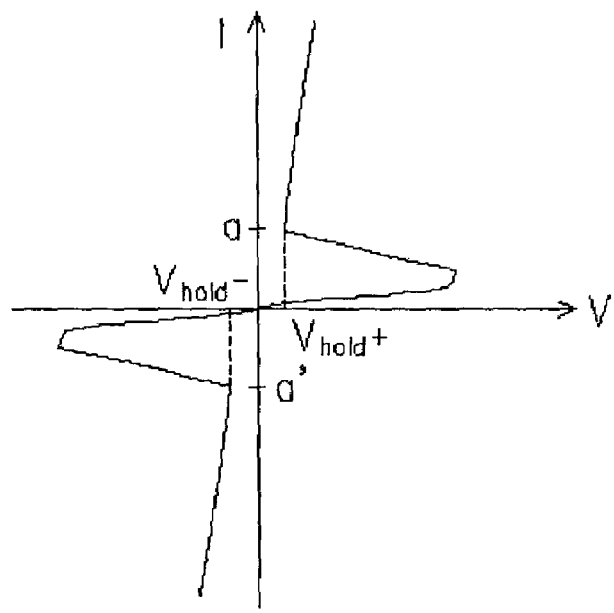
FIG. 4 is a voltage-current diagram of the EOS/ESD protection circuit in FIG. 3A.

FIG. 4 is the voltage-current diagram of the EOS/ESD protection circuit in FIG. 3A.

Under normal power operations, one of the two PN junctions, formed between the P-substrate 30 and the N+ doped region 34, and the P-substrate 30 and the N+ doped region 38, of the transistor $Q_{npn}$ is forward biased irrespective of the conductivity types of signals at the I/O pad 44. The whole EOS/ESD protection circuit remains an open circuit if amplitudes of the signals at the I/O pad 44 are smaller than breakdown voltages of the PN junctions shown in FIG. 4. Signals with either positive or negative voltages are allowed to pass from the I/O pad 44 to the inner circuit 46.

When a high positive voltage with respective to the power line VSS occurs at the I/O pad 44 during an EOS/ESD event, the PN junction between the P-substrate 30 and the N+ well 34 is broken down. A pseudo SCR formed by the floating P+ doped region 32, the N+ well 34, the P-substrate 30 and the N+ well 38 is triggered. The voltage at the I/O pad 44 is clamped to a low holding voltage $V_{hold+}$, as the voltage-current curve above a point a shown in FIG. 4. The ESD current $I_{dis+}$ is released from the I/O pad 44 to the power line VSS through the left part of the circuit in FIG. 3B and the inner circuit 46 is protected from the high ESD stress.

Similarly, when a high negative voltage with respect to the power line VSS occurs at the I/O pad 44 during an EOS/ESD event, the PN junction between the P-substrate 30 and the N+ well 38 is broken down. The voltage at the I/O pad 44 is clamped to a low holding voltage $V_{hold-}$, as the voltage-current curve below a point a' shown in FIG. 4. The ESD current $I_{dis}$ is released to the power line VSS through the right part of the circuit in FIG. 3B and the inner circuit 46 is protected from the high ESD stress.

The bi-directional ESD/EOS protection circuit of the present invention is suitable for application of an I/O pad transmitting both positive and negative signals, and thus provides good EOS/ESD protection.

In order to achieve a bi-directional EOS/ESD protection, the P-substrate in FIG. 3A must be floating. However, most P-substrates in current IC designs are coupled to a grounded power line VSS. The EOS/ESD protection circuit of the present invention can alternatively be implemented by a floating P-well shown in FIG. 5 to avoid the problem of grounded P-substrates.

Figure 5:
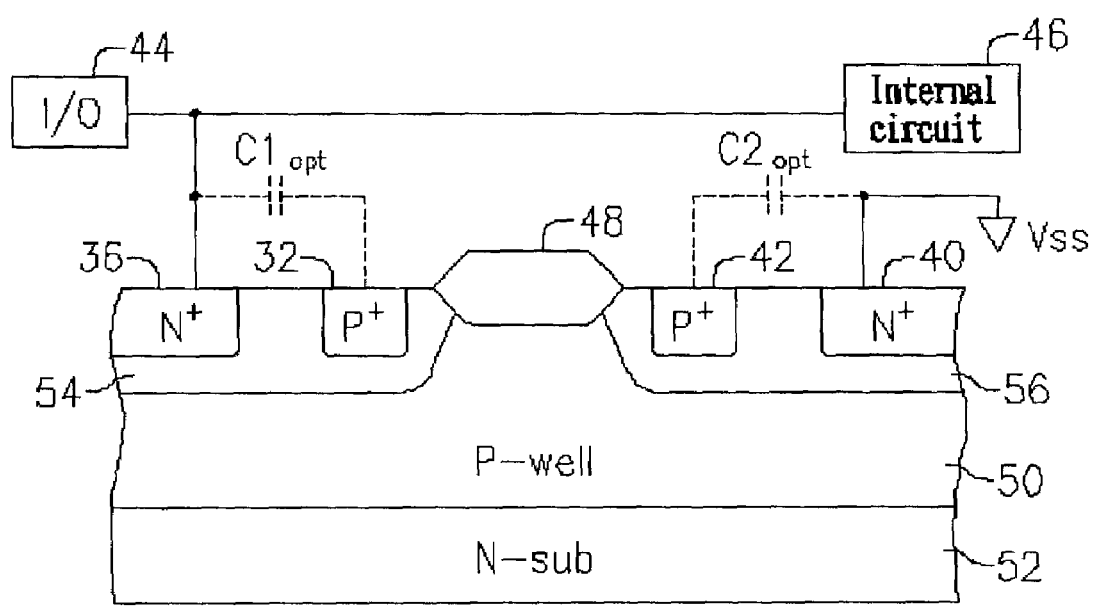
FIG. 5 is an embodiment of the present invention implemented by a floating P-well.

In FIG. 5, a floating P-well 50 is formed on an N-substrate 52. The N-wells 34 and 38 in FIG. 3A are replaced with N-DDD doped regions 54 and 56. The N-DDD doped regions 54 and 56 are formed simultaneously with DDD structures in sources/drains of NMOSs in a semiconductor process. An N-DDD ion implantation process is usually added to a semiconductor process to sustain higher ESD stress. Therefore, NMOSs coupled to I/O pads always have drains/sources with DDD structures. The N-DDD doped regions 54 and 56 in FIG. 5 can be implemented with an N-DDD ion implanting process so that the EOS/ESD protection circuit is compatible to the current semiconductor processes. Nonetheless, the method utilizing an N-DDD ion implantation process is only one embodiment of the present invention. The N-DDD doped regions 54 and 56 can also be formed using other methods.

Figure 1A:
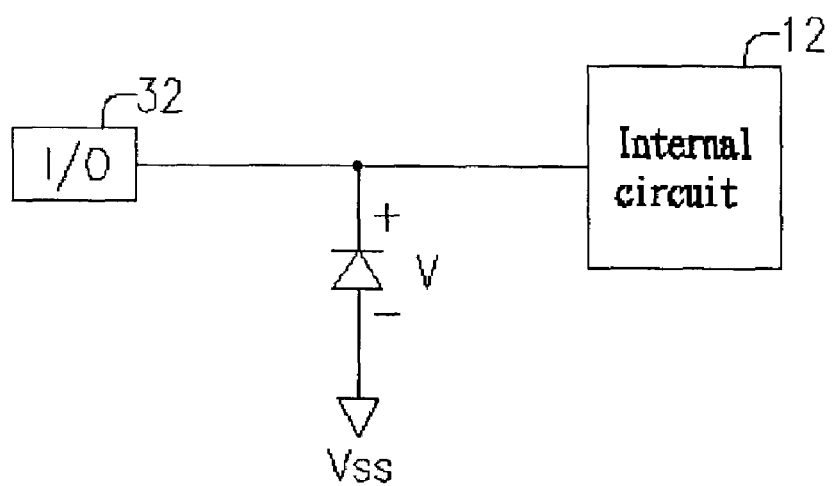
FIG. 1A is a conventional EOS/ESD protection circuit implemented by a diode.
Figure 1B:
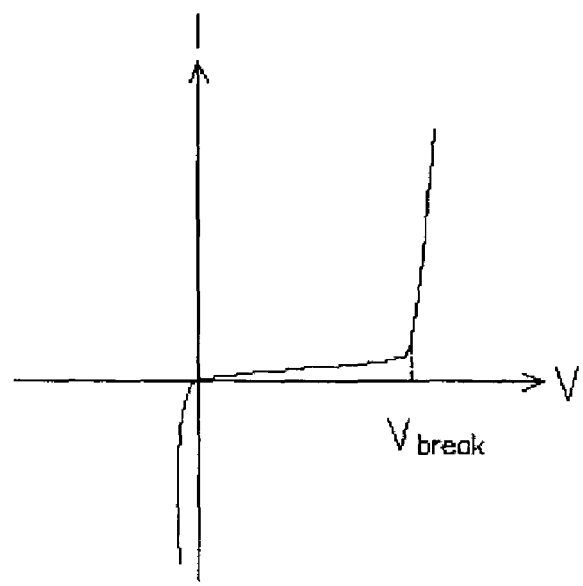
FIG. 1B is a voltage current diagram of the circuit in FIG. 1A.
Figure 2A:
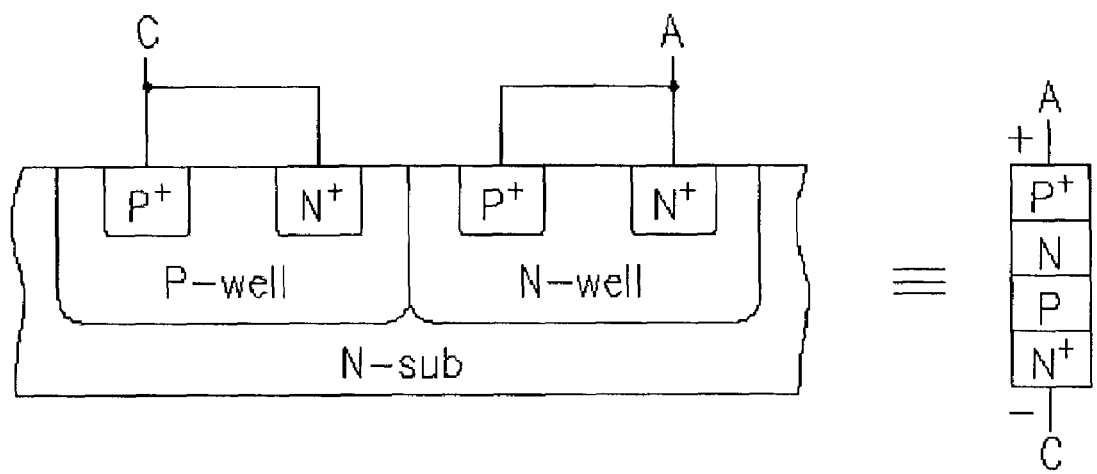
FIG. 2A is a conventional EOS/ESD protection circuit implemented by a SCR.
Figure 2B:
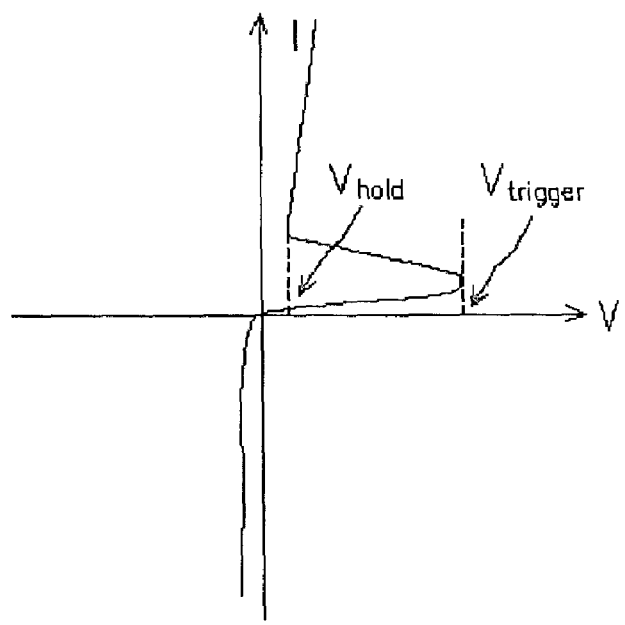
FIG. 2B is a voltage current diagram of the circuit in FIG. 2A.
Figure 2C:
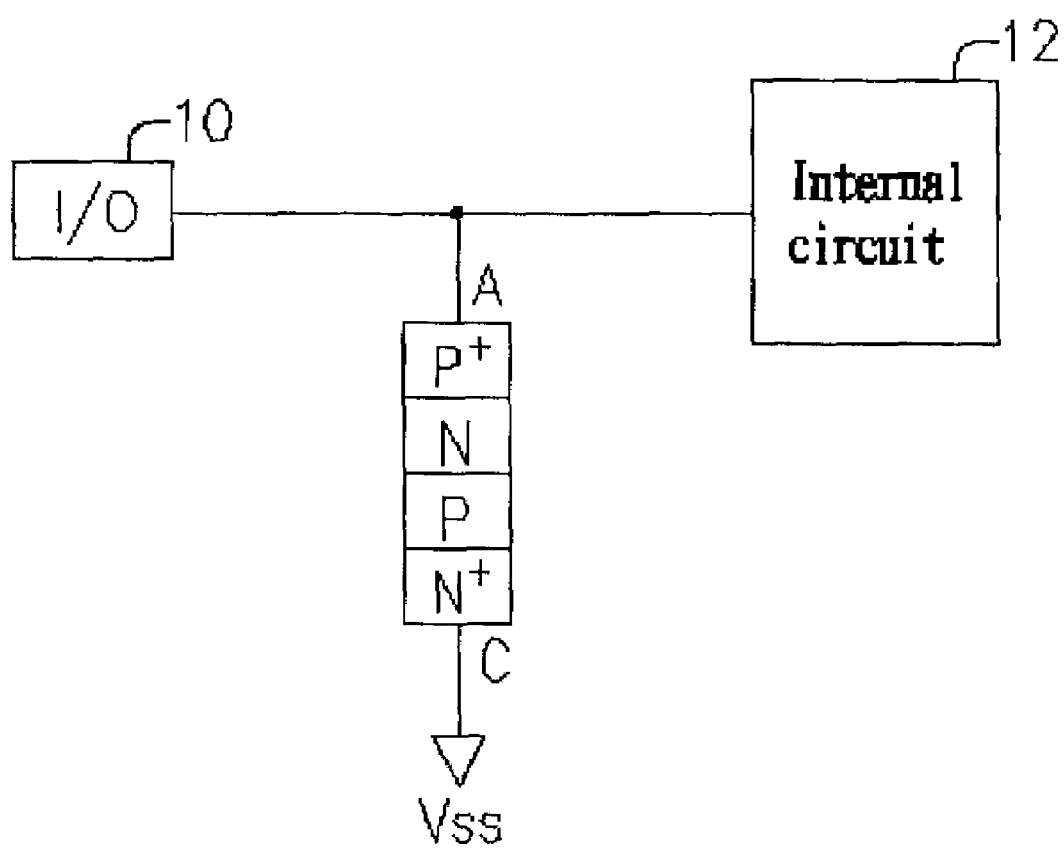
FIG. 2C is a schematic diagram of the SCR protection circuit utilized in an I/O pad.
Figure 6A:
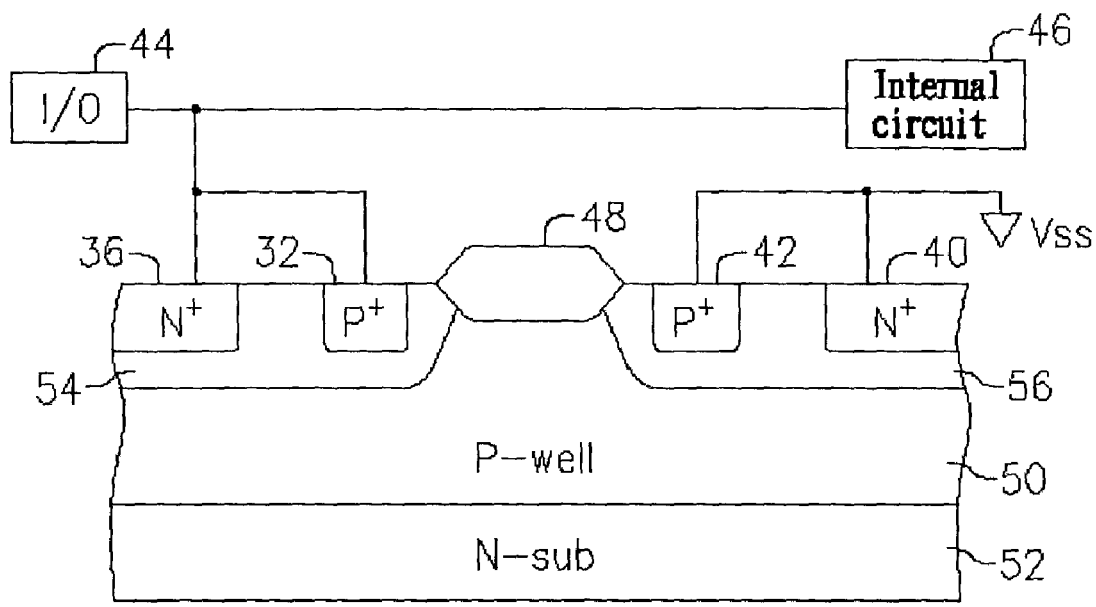
FIG. 6A is another embodiment of the present invention.
Figure 6B:
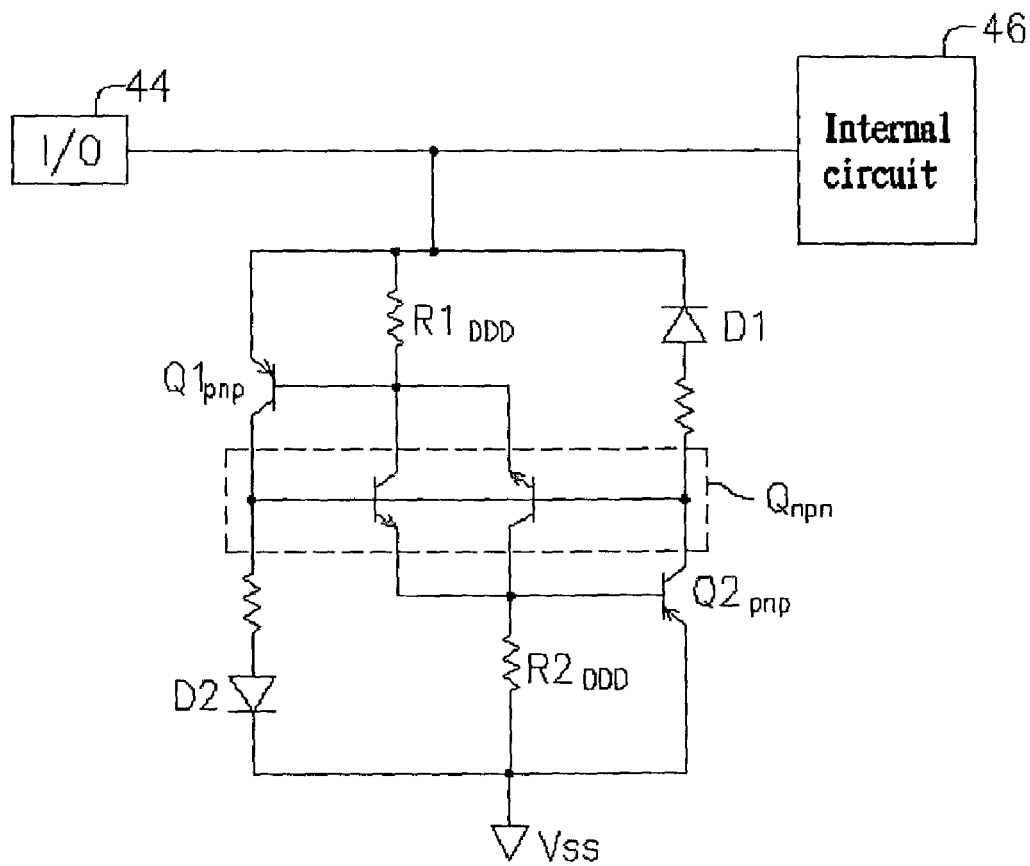
FIG. 6B is an equivalent circuit of FIG. 6B.

The P+ doped region 32 can be coupled directly to the I/O pad 44 and the P+ doped region 42 can be coupled directly to the power line VSS as shown in FIG. 6A. FIG. 6B shows an equivalent circuit of FIG. 6A. The voltage-current diagram of FIG. 6A is similar to that of FIG. 4. In FIG. 6B, both the left and the right parts of the circuit have SCR-like structures. The voltage-current diagram in FIG. 4 shows the EOS/ESD structure of the present invention distinguished from a conventional SCR shown in FIG. 2C. The EOS/ESD protection circuit of the present invention thus proves to provide good bi-directional EOS/ESD protection.

Figure 7:
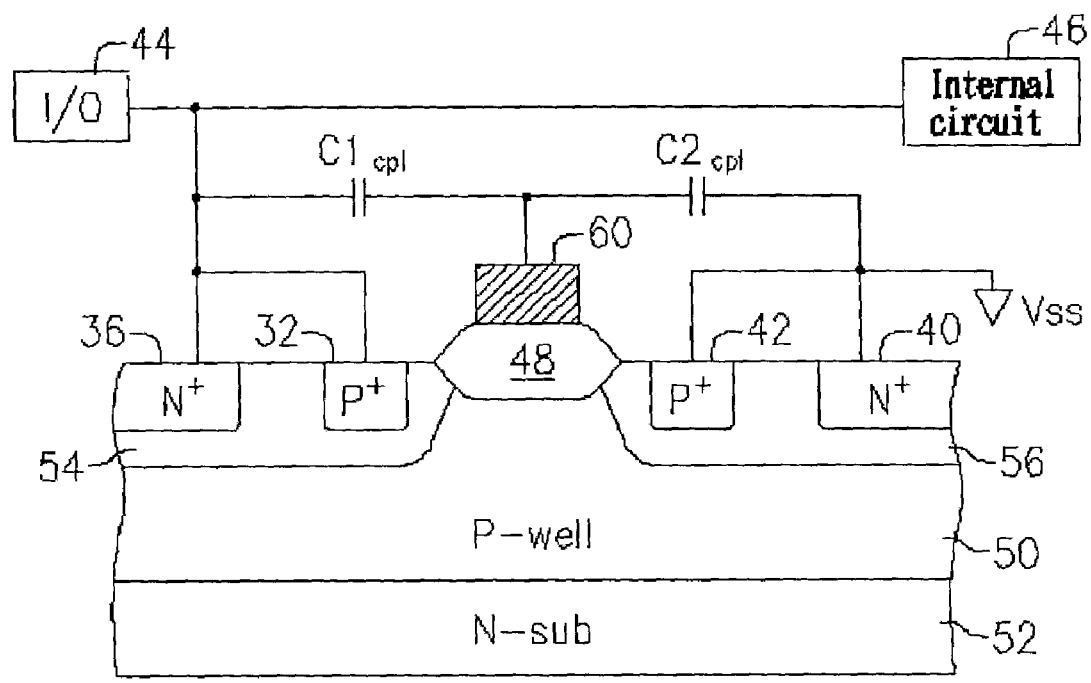
FIG. 7 is an embodiment of the present invention implemented by a gate structure.

A gate structure can be formed between the N-wells or the N-DDD doped regions so that transient voltages at an I/O pad or a power line VSS can be partially diverted to a conductive layer of the gate structure and triggering speeds of the SCRs are increased, as shown in FIG. 7, an embodiment of the present invention utilizing a gate structure located between the N-wells 54 and 56. The gate structure is formed by a field oxide layer 48 as an isolating layer and a poly-silicon conductive layer 60 as a gate. A coupling capacitor $C1_{cp1}$ is coupled between the poly-silicon conductive layer 60 and an I/O pad 44. The other coupling capacitor $C2_{cp1}$ is coupled between the poly-silicon conductive layer 60 and a power line VSS.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A bi-directional EOS/ESD protection device, suitable for application of an I/O port, comprising:
    a P-type semiconductor layer;
    a first N-type conductive layer and a second N-type conductive layer, formed separately on the P-type semiconductor layer;
    a first P-type doped region, formed on the first N-type conductive layer; and
    a second P-type doped region, formed on the second N-type conductive layer;
    wherein the first N-type conductive layer is coupled to an I/O pad; the second N-type conductive layer is coupled to a power line; and the first P-type doped region and the second P-type doped region are floating with respect to the I/O pad and the power line respectively.

2. The bi-directional EOS/ESD protection device in claim 1, wherein the P-type semiconductor layer is a P-well formed on an N-substrate.

3. The bi-directional EOS/ESD protection device in claim 2, wherein the first N-type conductive layer and the second N-type conductive layer are N-DDD regions formed simultaneously with DDD structures in an IC process.

4. The bi-directional EOS/ESD protection device in claim 1, wherein the bi-directional EOS/ESD protection device further comprises a first N-type doped region formed on the first N-type conductive layer and coupled to the I/O pad, and a second N-type doped region formed on the second N-type conductive layer and coupled to the power line.

5. The bi-directional EOS/ESD protection device in claim 4, wherein the first P-type doped region surrounds the first N-type doped region.

6. The bi-directional EOS/ESD protection device in claim 4, wherein the second P-type doped region surrounds the first P-type doped region.

7. The bi-directional EOS/ESD protection device in claim 4, wherein the second N-type doped region surrounds the second P-type doped region.

8. The bi-directional EOS/ESD protection device in claim 1, wherein a field oxide layer is formed between the first N-type conductive layer and the second N-type conductive layer.

9. The bi-directional EOS/ESD protection device in claim 8, wherein a poly-silicon conductive layer is formed on the field oxide layer.

10. The bi-directional EOS/ESD protection device in claim 9, wherein a first capacitor is formed between the I/O pad and the poly-silicon conductive layer, and a second capacitor is formed between the poly-silicon conductive layer and the power line.

11. The bi-directional EOS/ESD protection device in claim 1, wherein the first P-type doped region and the second P-type doped region are formed simultaneously with drains/sources of PMOS transistors in an IC process.

12. The bi-directional EOS/ESD protection device in claim 1, wherein the first N-type doped region and the second N-type doped region are formed simultaneously with drains/sources of NMOS transistors in an IC process.

13. The bi-directional EOS/ESD protection device in claim 1, wherein the P-type semiconductor layer is a P-substrate.

14. A bi-directional EOS/ESD protection device, suitable for application of an I/O port, comprising:
    a P-type semiconductor layer;
    a first N-type conductive layer and a second N-type conductive layer, formed separately on the P-type semiconductor layer;
    a first P-type doped region, formed on the first N-type conductive layer;
    a second P-type doped region, formed on the second N-type conductive layer;
    a field oxide layer, formed between the first N-type conductive layer and the second N-type conductive layer; and
    a poly-silicon conductive layer, formed on the field oxide layer.

15. The bi-directional EOS/ESD protection device in claim 14, wherein a first capacitor is formed between the I/O pad and the poly-silicon conductive layer, and a second capacitor is formed between the poly-silicon conductive layer and the power line.

* * * * *